United States Patent [19]

Ikeda

[11] Patent Number: 5,046,029
[45] Date of Patent: Sep. 3, 1991

[54] ELECTRONIC ODO/TRIP METER FOR AUTOMOBILES

[75] Inventor: Hiroshi Ikeda, Kanagawa, Japan

[73] Assignee: Nissan Motor Company, Ltd., Japan

[21] Appl. No.: 281,772

[22] Filed: Dec. 8, 1988

[30] Foreign Application Priority Data

Dec. 9, 1987 [JP] Japan .................................. 62-311722

[51] Int. Cl.⁵ .............................................. G01C 22/00
[52] U.S. Cl. .................................. 364/561; 235/95 R; 377/24.1
[58] Field of Search ............... 235/95 R, 97; 324/169; 364/561, 565; 377/24.1

[56] References Cited

U.S. PATENT DOCUMENTS

| | | | |
|---|---|---|---|
| 4,528,683 | 7/1985 | Henry | 377/24.1 |
| 4,539,641 | 9/1985 | Kawashimo et al. | 364/561 X |
| 4,591,782 | 5/1986 | Germer | 371/66 X |
| 4,665,497 | 5/1987 | Yamamura et al. | 235/95 R X |
| 4,710,888 | 12/1987 | Burke et al. | 377/24.1 X |
| 4,757,522 | 7/1988 | Kieselstein | 377/24.1 X |
| 4,803,646 | 2/1989 | Burke et al. | 377/24.1 X |

Primary Examiner—Parshotam S. Lall
Assistant Examiner—Edward R. Cosimono
Attorney, Agent, or Firm—Lowe, Price, LeBlanc & Becker

[57] ABSTRACT

An electronic odo/trip meter for automobiles has a display for displaying a travel distance, a counter for enumerating the travel distance data, a non-volatile memory which is provided in the counter so as to prevent elimination of the travel distance data, and a control circuit which controls data transfer and includes a first detection circuit for detecting voltage-drop of a power supply and a second detection circuit for detecting resumption of the power supply. In the device according to the invention, the travel distance data of the counter can be stored in the non-volatile memory only when the first detection circuit detects a drop in the power supply, and the travel distance data of the non-volatile memory can be transferred into the counter only when the second detection circuit detects the resumption of the power supply.

13 Claims, 2 Drawing Sheets

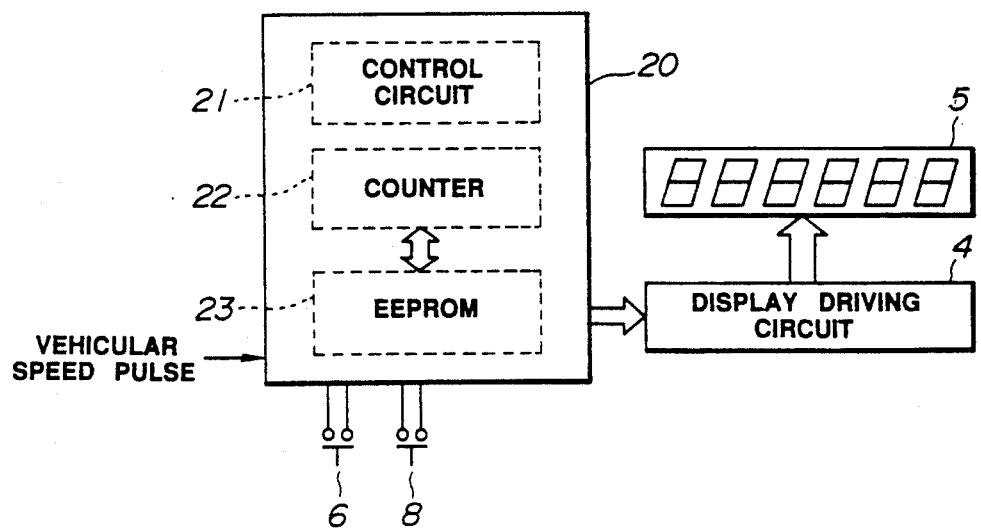
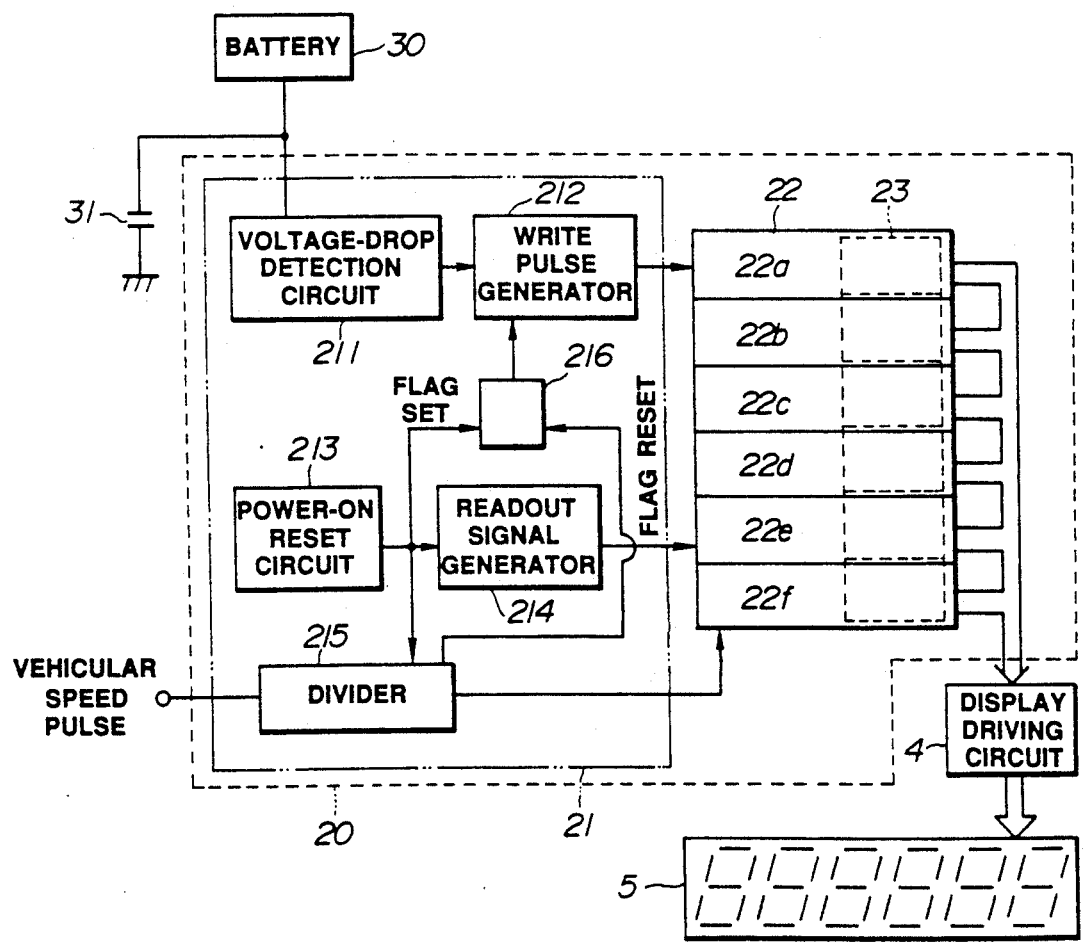

ELECTRONIC ODO/TRIP METER FOR AUTOMOBILES

BACKGROUND OF THE INVENTION

1. Field of the Invention

The present invention relates to an electronic odo/trip meter, and particularly to an electronic odo/trip meter having a non-volatile memory. Specifically, the present invention relates to an electronic odo/trip meter wherein travel distance data is stored into the non-volatile memory only when a power source is cut off or becomes less than a predetermined voltage.

2. Description of the Prior Art

Recently, various electronic odo/trip meters applicable in automobiles have been proposed and developed. One such electronic odo/trip meter for automobiles is disclosed in the Jidosha Gijutsu Vol. 38, Page 185-186, published on 1984. This type of electronic odo/trip meter is shown in FIG. 1.

As shown in FIG. 1, the odo/trip meter 100 comprises a micro computer 1, a read write memory (RWM) 2, and an electrically erasable programmable read only memory (EEPROM) 3. The micro computer 1 processes a speed pulse signal indicative of vehicular speed and determines the sum of travel distance which will be hereinafter referred to as travel distance data. The micro computer 1 rewrites the travel distance data stored in the RWM 2 every 0.1 km and rewrites the data stored in the EEPROM 3 every 0.8 km. The data of the RWM 2 and the EEPROM 3 are displayed through a display driving circuit 4 in a display panel 5, respectively. A read write memory 7 is applied to store trip data indicative of a short travel distance. A switch 6 is used for switching the data to be displayed on the display panel 5, namely the overall travel distance data and the short travel distance data. A switch 8 is used for resetting the travel distance data stored in the RWM 7.

Specifically, the EEPROM 3 is provided so as to prevent elimination of the travel distance data if the power source is cut off due, for example, to power switch OFF, electric discharge of battery, breakage of battery, etc. As set forth above, since the EEPROM 3 is updated every 0.8 km, the travel distance data stored in the EEPROM varies within a range of an error 0.8 km relative to the true distance. When the travel distance data is stored in the EEPROM 3, the travel distance data is simultaneously stored in three different addresses of the EEPROM 3. Therefore, when the travel distance data is derived from the EEPROM, the three travel distance data are derived from the three different addresses and then these data are processed in a majority operation of the micro computer 1, thereby producing a highly reliable data. As the travel distance data is rewritten frequently, preferably a plurality of memory addresses of the EEPROM should be used in order to avoid frequent use of a particular address so as to prevent degradation of the particular memory cells.

FIG. 2 is a prior art electronic odo/trip meter having an IC 10 which includes a control circuit 11 and a counter 12 and is connected to an EEPROM 13. The EEPROM 13 is external to the IC 10. The vehicular speed pulse signal is inputted into the IC 10 and is processed by the control circuit 11 with the result that the travel distance data is determined. As a result, the counter 12 counts up predetermined travel distance increments, for example 0.1 km. The enumerated value of the counter 12 is displayed through the display driving circuit 4 in the display panel 5. On the other hand, the enumerated value of the counter 12 is written into the EEPROM 13 at predetermined increments.

Essentially, since the EEPROM 3 or 13 is used for storing the travel distance data even if the power source is cut off, it would be highly desirable for the data stored in the RWM 2 or the counter 12 to be transmitted into the EEPROM 3 or 13 only when the power source is cut off. However, the prior art odo/trip meter employs an off the shelf commercial EEPROM, which demands relatively great deal of current. Therefore, when the power source is cut off, it is difficult to update the travel distance data in the EEPROM by means of a back-up power source because of the relatively the low capacity of the back-up power source. Therefore, as set forth above, the travel distance data of the EEPROM is rewritten at predetermined intervals. If the travel distance data is stored only in particular addresses of the EEPROM when the data is rewritten every predetermined distances, the particular memory cells most frequently used tend to deteriorate. Many electronic elements are required to distribute the work load among the addresses in the EEPROM.

The odo/trip meter can usually display a six figure decimal so as to give maximum displayable travel distance 99,999.9 km. 9 in the decimal system corresponds to 1001 in the binary system. Therefore, since six figures in decimal numerals corresponds to $6 \times 4 = 24$ figures in the binary system, a 24 bit memory is required in the RWM 2 and the counter 12. However, since commercial 8 bit EEPROMs are conventionally used as the non-volatile memory, the travel distance data are divided into several bytes and distributed among a plurality of EEPROMs.

In the above system, there is the likelihood that the power source may become cut off or lowered when the travel distance data are being stored in the memories of the EEPROM 3 and 13. Therefore, fail-safe circuit is required so as to prevent failure of the data transfer.

Thus, in the existing odo/trip meters, many extra electronic parts are required, thereby increasing the cost of the product and electric power consumption and limiting the compactness of the arrangement. Thus, the main purpose of the invention is to prevent failure of the data transfer and to provide a compact odo/trip meter.

SUMMARY OF THE INVENTION

It is, therefore, a primary object of the disclosed invention to provide an electronic odo/trip meter for automobiles in which the number of times travel distance data is rewritten is relatively small and failure of the data transfer is reduced. This is achieved by rewriting the travel distance data in the non-volatile memory which is connected to the counter bit by bit, only when the power source is cut off or is lower than a predetermined threshold voltage.

Another object of the invention is to provide an electronic odo/trip meter in which electric power consumption is relatively small.

A further object of the invention is to provide an electronic odo/trip meter in which the control circuit is simple.

In order to accomplish the aforementioned and other objects, an electronic odo/trip meter for automobiles according to the invention, comprises count means for enumerating an automotive travel distance and capable of outputting travel distance data, display means for displaying the travel distance data, non-volatile memory means, which is connected to the count means bit by bit, for storing the travel distance data, control means for controlling write/readout operation of the travel distance data to the non-volatile memory means, and the control means comprising a first detection means which detects a first condition wherein the power supply from a power source is cut off or is lower than a predetermined threshold voltage and a second detection means which detects a second condition wherein the power supply is producing voltage which exceeds the threshold value, whereby the travel distance data of the count means can be stored in the non-volatile memory means only when the first detection means detects the first condition, and the travel distance data of the non-volatile memory means can be transferred into the count means only when the second detection means detects the second condition.

The count means is comprised of six counter elements each consisting of a 4-bit counter. The display means is comprised of a display driving circuit and a liquid crystal display panel. The non-volatile memory means may consist of an electrically erasable programmable read only memory. Preferably, the count means and the non-volatile memory means are connected bit by bit and provided on one chip.

Alternatively, the display driving circuit, the count means, and the non-volatile memory means may be provided on one chip.

According to another aspect of the invention, an electronic odo/trip meter for automobiles comprises count means for enumerating a travel distance and capable of outputting travel distance data, display means for displaying the travel distance data, non-volatile memory means for storing the travel distance data, control means for controlling write/readout operation of the travel distance data to the non-volatile memory means, and the control means comprising a first detection means which detects a first condition wherein the power supply from a power source is cut off or is lower than a predetermined threshold voltage, a second detection means which detects a second condition wherein the power supply is above said threshold voltage, and a write inhibit means for inhibiting the write operation during data transfer operation wherein the travel distance data is transferred from the non-volatile memory means to the counter means, so that the travel distance data of the count means can be stored in the non-volatile memory means only when the first detection means detects the first condition, and the travel distance data of the non-volatile memory means can be transferred into the count means only when the second detection means detects the second condition.

BRIEF DESCRIPTION OF THE DRAWINGS

FIG. 3 is a schematic block diagram illustrating the electronic odo/trip meter of the preferred embodiment of the invention; and FIG. 4 is a detailed block diagram of an IC circuit of an electronic odo/trip meter of the preferred embodiment according to the invention.

DESCRIPTION OF THE PREFERRED EMBODIMENT

Figure 1:
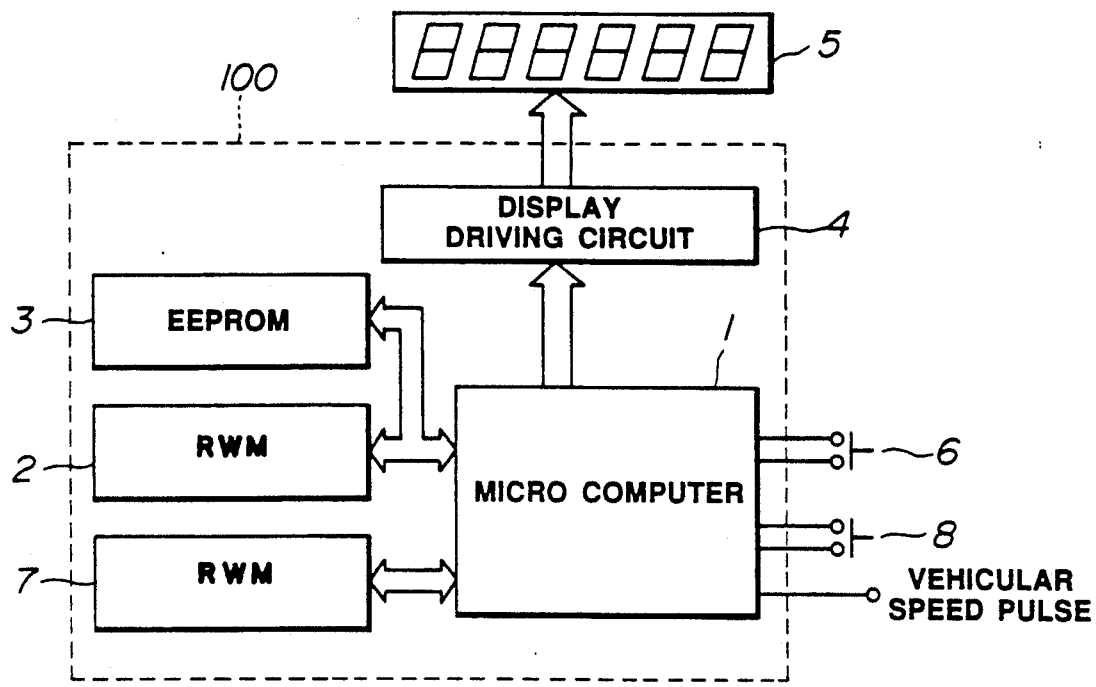
FIG. 1 is a schematic block diagram illustrating a prior art electronic odo/trip meter for automobiles in which a microcomputer serves as a control circuit.
Figure 2:
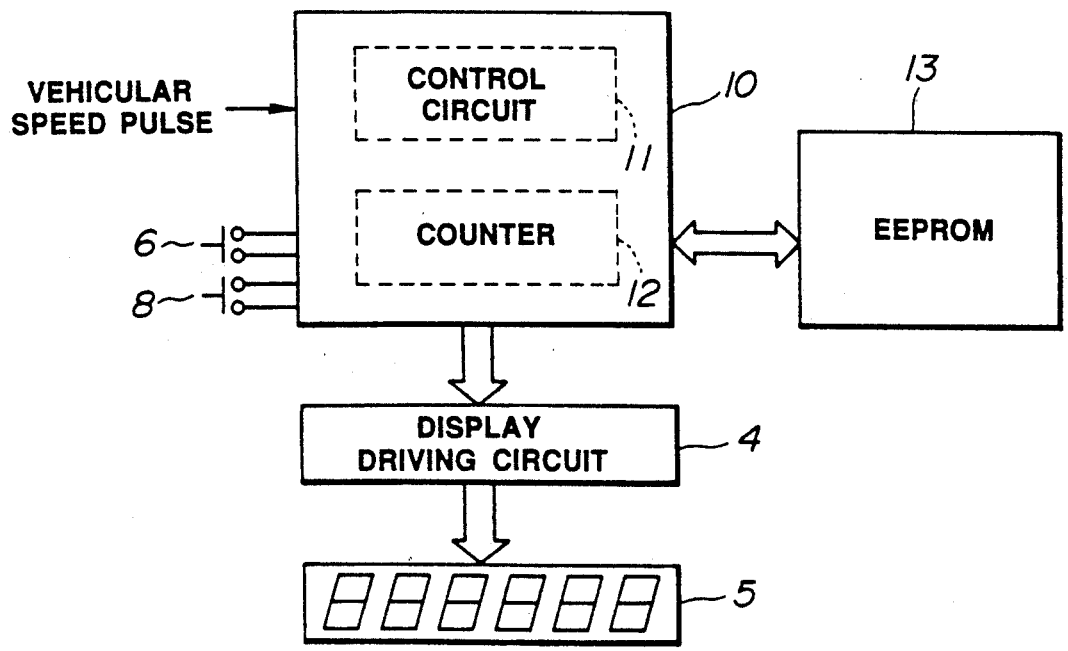
FIG. 2 is a schematic block diagram illustrating a prior art electronic odo/trip meter for automobiles in which a particular IC serves as a control circuit.

Referring now to FIG. 3, the preferred embodiment of an electronic odo/trip meter comprises an IC 20. The IC 20 comprises a control circuit 21, a counter 22, and an electrically erasable programmable read only memory (EEPROM) 23 which is provided in the counter 22, i.e., EEPROM is connected to the counter 22 bit by bit, and which serves as a 24-bit non-volatile memory. The IC connects through a display driving circuit 4 to a display panel 5. The counter 22 is incremented by a vehicular speed pulse inputted into the IC 20 with the result that travel distance data indicative of the sum of the travel distance is gained. The EEPROM 23 is used to store the travel distance data of the counter 22 when a power source, such as a battery, is cut off or its voltage falls below a predetermined threshold voltage. Further, the control circuit 21 is used for controlling data transfer between the counter 22 and the EEPROM 23, the counter 22 and the display driving circuit 4, and the EEPROM 23 and the display driving circuit 4. As is well known, a liquid crystal display panel is used as the display panel 4. Switches 6 and 8 are respectively used for switching the travel distance data and the short travel distance data and for resetting the short travel data.

As shown in FIG. 4, the control circuit 21 includes a voltage drop detection circuit 211 which is capable of detecting that the voltage of a battery 30 is lower than a predetermined threshold value and producing a detection signal. The control circuit 21 further includes a pulse generating circuit 212 in which a pulse indicative of a write signal is supplied to the counter 22 in response to the detection signal from the detection circuit 211. As soon as the pulse from the pulse generating circuit 212 is supplied to the counter 22, the travel distance data stored in the counter 22 is transferred into the EEPROM 23 bit by bit with the aid of a back-up condenser 31 which functions as a back-up power source.

Furthermore, the control circuit 21 includes a power-on reset circuit 213 which outputs an initialization signal when the battery becomes ON again, a readout signal generator 214 which outputs a readout signal in response to the initialization signal, and a divider 215 in which the vehicular speed pulse is divided and is supplied to the counter 22. Also, the control circuit 21 includes a write inhibit flag set/reset circuit 216 in which a write inhibit flag is set so as to prevent the output pulse from the pulse generating circuit 212 and the write inhibit flag is reset in response to a flag reset signal outputted from the divider 215. As soon as the readout signal from the signal generator 214 is outputted into the counter 22, the travel distance data is derived from the EEPROM 23 and then transferred to the counter 22 bit by bit.

The counter 22 is capable of counting up six figures in decimal system and comprises six counter elements 22a, 22b, 22c, 22d, 22e, and 22f each consisting of a four bit counter. The counter elements 22a to 22f respectively count up 0.1 km, 1 km, 10 km, 100 km, 1,000 km and 10,000 km increments. As set forth above, the counter elements operate according to binary coded decimal notation (BCD).

The operations of the electronic odo/trip meter of the preferred embodiment according to the present invention will be more clearly understood from the following detailed description.

When the power source is cut off or falls too low:

As soon as a value of voltage of the battery 30 is smaller than the predetermined threshold value, the voltage drop detection circuit 211 outputs the detection signal;

The pulse generating circuit 212 outputs the write pulse signal in response to the detection signal; and Next, the travel distance data of the counter 22 is written in the EEPROM 23 directly bit by bit in response to the write pulse signal.

When the power source resumes proper operation:

When the battery 30 becomes ON again, the initialization signal is outputted from the power-on reset circuit 213 to the write inhibit flag set/reset circuit 216 and the readout signal generator 214.

The write inhibit flag set/reset circuit 216 outputs the write inhibit flag into the pulse generating circuit 212 in response to the initialization signal and as a result the write pulse signal is held in the pulse generating circuit 212 and the write pulse signal is not outputted to the counter 22. Thereby the transfer of data to the EEPROM 23 is prevented.

On the other hand, the readout signal generator 214 outputs the readout signal into the counter 22 in response to the initialization signal and as a result the travel distance data in the EEPROM 23 is set in the counter 22 and simultaneously the data in the EEPROM 23 is displayed through the display driving circuit 4 in the display panel 5.

Next, when the vehicular speed pulse divided by the divider 215 is again outputted into the counter 22, the flag reset signal is inputted into the write inhibit flag set/reset circuit 216 and as a result the write inhibit flag is reset. As a result, the electronic odo/trip meter is in an initial condition in which the counter can be counted up in accordance with the vehicular speed pulse divided by the divider 215 and the pulse generating circuit 212 can output the write pulse signal into the counter 22 according to the detection signal from the voltage drop detection circuit 211.

In the odo/trip meter according to the invention, the write pulse signal is inhibited by the write inhibit flag until the data transfer from the EEPROM 23 to the counter 22 is completed. This is because random data is transferred into the EEPROM 23 if the data transfer between the EEPROM 23 and the counter 22 has not been completed at the time the signal is output from the write pulse generator 212. Therefore, after the resumption of the power source, the write inhibit flag is maintained for a period determined so as to allow completion of the data transfer.

When the power source is ON:

The vehicular speed pulse is divided by the divider 215 and is inputted into the counter 22 and as a result the counter 22 is incremented every 0.1 km.

Thereafter, the counted travel distance data is outputted into the display driving circuit 4 and as a result the travel distance is displayed in the display panel 5.

In this construction, since the EEPROM is compact and the electric consumption of the EEPROM 23 is smaller than that of the commercial EEPROM. Therefore, power for transferring information from the counter 22 to the EEPROM 23 can be provided by a back-up condenser 31 having a relatively small capacity. Furthermore, since the data transfer is performed only when the power source becomes cut off, the number of times information is written into the EEPROM 23 is greatly reduced. As a result, a life of the EEPROM is increased. By providing the EEPROM 23 within the counter 22, i.e., the two are connected bit by bit, the control circuit becomes simple and the data transfer is effectively achieved.

Furthermore, since the number of times the data transfer between the counter 22 and the EEPROM 23 is decreased, change in the addresses for the write is not required. This greatly simplifies the control circuit for the data transfer and reduces failures of data transfer.

Moreover, since the counter 22 and the EEPROM 23 are provided on one chip, parallel data transfer is possible.

As will be appreciated from the above, the control circuit according to the invention is greatly simplified.

Although in the above disclosed embodiment the display driving circuit 4 is separate from the counter 22, the display driving circuit 4 and the counter 22 may be provided on one chip so as to accomplish more effective data transfer.

Although in the above disclosed embodiment an electrically erasable programmable read only memory (EEPROM) is used as the non-volatile memory, other kinds of non-volatile memory may be used.

The invention may be embodied in other specific forms without departing from the spirit or essential characteristics thereof.

What is claimed is:

1. An electronic odo/trip meter for automobiles comprising:

count means for enumerating travel distance and for outputting travel distance data;

display means connected to said count means for displaying said travel distance data derived from said count means;

non-volatile memory means directly connected to exactly corresponding locations of said count means so as to provide parallel data transfer between said count means and said non-volatile memory;

control means for controlling write/readout operation of said travel distance data to and from said non-volatile memory means;

said control means comprising:

first detection means for detecting a first state wherein power supply from a battery attains one of two conditions including a power cut off condition and a condition wherein an output voltage provided by the battery becomes less than a predetermined threshold voltage, said first detection means generating a first signal indicating that the battery is in said first state;

second detection means for detecting a second state wherein the power supply from the battery becomes greater than said threshold voltage, said second detection means generating a second signal indicating that the battery is in said second state;

said control means controlling said write/readout operation such that the travel distance data of said non-volatile memory means is renewed with the travel distance data of said count means only when said count means receives the first signal from said first detection means, while the travel distance data of said count means is renewed with the travel distance data of said non-volatile memory means only when said count means receives the second signal from said second detection means; and a back-up power source connected to said count means for supplying power required for a data transfer operation from said count means to said non-volatile memory means for a predetermined period determined to allow completion of the data transfer operation, said back-up power source including a back-up condenser for temporarily supplying power to said count means only when the power supplied from the battery is in said first state.

2. An electronic odo/trip meter as set forth in claim 1, wherein said count means is comprised of six counter elements each consisting of a 4-bit counter.

3. An electronic odo/trip meter as set forth in claim 1, wherein said display means is comprised of a display driving circuit and a liquid crystal display panel.

4. An electronic odo/trip meter as set forth in claim 3, wherein said display driving circuit, said count means, and said non-volatile memory means are provided on one chip.

5. An electronic odo/trip meter as set forth in claim 1, wherein said non-volatile memory means consists of an electrically erasable programmable read only memory.

6. An electronic odo/trip meter as set forth in claim 5, wherein said count means and said non-volatile memory means are provided on one chip.

7. An electronic odo/trip meter for automobiles comprising:
 count means for enumerating travel distance and for outputting travel distance data;
 display means connected to said count means for displaying said travel distance data derived from said count means;
 non-volatile memory means directly connected to exactly corresponding locations of said count means so as to provide parallel data transfer between said count means and said non-volatile memory;
 control means for controlling write/readout operation of said travel distance data to and from said non-volatile memory means;
 said control means comprising:
 first detection means for detecting a first state wherein power supply from a battery attains one of two conditions including a power cut off condition and a condition wherein an output voltage provided by the battery becomes less than a predetermined threshold voltage, said first detection means generating a first signal indicating that the battery is in said first state;
 second detection means for detecting a second state wherein the power supply from the battery becomes greater than said threshold voltage, said second detection means generating a second signal indicating that the battery is in said second state;
 write inhibit means for inhibiting a write operation of said write/readout operation in response to the second signal during a data transfer operation wherein said travel distance data is transferred from said non-volatile memory to said counter means in such a manner as to prevent the output of the first signal from said first detection means to said count means for a predetermined period determined to allow completion of the data transfer operation;
 said control means controlling said write/readout operation such that the travel distance data of said non-volatile memory means is renewed with the travel distance data of said count means only when said count means receives the first signal from said first detection means, while the travel distance data of said non-volatile memory means only when said count means receives the second signal from said second detection means; and
 a back-up power source connected to said count means for supplying power required for the data transfer operation from said count means to said non-volatile memory means for the predetermined period.

8. An electronic odo/trip meter as set forth in claim 7, wherein said count means is comprised of six counter elements each consisting of a 4-bit counter.

9. An electronic odo/trip meter as set forth in claim 7, wherein said back-up power source includes a back-up condenser for temporarily supplying power to said count means only when the power supplied from the battery is in said first state.

10. An electronic odo/trip meter as set forth in claim 7, wherein said display means is comprised of a display driving circuit and a crystalline liquid display panel.

11. An electronic odo/trip meter as set forth in claim 10, wherein said display driving circuit, said count means, and said non-volatile memory means are provided on one chip.

12. An electronic odo/trip meter as set forth in claim 7, wherein said non-volatile memory means consists of an electrically erasable programmable read only memory.

13. An electronic odo/trip meter as set forth in claim 12, wherein said count means and said non-volatile memory means are provided on one chip.

* * * * *